US011755411B2

(12) United States Patent
Roy et al.

(10) Patent No.: US 11,755,411 B2
(45) Date of Patent: Sep. 12, 2023

(54) ERROR RATE REDUCTION IN A NON-VOLATILE MEMORY (NVM), INCLUDING MAGNETO-RESISTIVE RANDOM ACCESS MEMORIES (MRAMS)

(71) Applicant: NXP USA, Inc., Austin, TX (US)

(72) Inventors: Anirban Roy, Austin, TX (US); Nihaar N. Mahatme, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/809,655

(22) Filed: Jun. 29, 2022

(65) Prior Publication Data

US 2022/0327020 A1 Oct. 13, 2022

Related U.S. Application Data

(62) Division of application No. 17/247,376, filed on Dec. 9, 2020, now Pat. No. 11,379,307.

(51) Int. Cl.
*G06F 11/10* (2006.01)
*G11C 11/16* (2006.01)

(52) U.S. Cl.
CPC ...... *G06F 11/1072* (2013.01); *G11C 11/1675* (2013.01)

(58) Field of Classification Search
CPC ............ G06F 11/1072; G06F 11/1012; G11C 11/1675; G11C 29/10; G11C 29/42; G11C 29/48
See application file for complete search history.

(56) References Cited

U.S. PATENT DOCUMENTS

| | | | | |
|---|---|---|---|---|
| 8,677,211 B2* | 3/2014 | Bandholz | ............ | G06F 11/1048 714/763 |
| 11,461,174 B2* | 10/2022 | Lu | ........................ | G06F 11/1068 |
| 2012/0166904 A1* | 6/2012 | Bandholz | ............ | G06F 11/1048 714/746 |
| 2016/0085622 A1* | 3/2016 | Andre | ................... | H04L 1/0045 714/764 |

* cited by examiner

*Primary Examiner* — Thien Nguyen

(57) ABSTRACT

A magnetoresistive random-access memory (MRAM) device includes an array of MRAM bit cells grouped into words, each word having specified number of data bit cells, error correction code (ECC) bit cells, and at least two inversion indicator bit cells, the inversion indicator bit cells being redundant of each other; and a memory controller. The memory controller is configured to, for each of the words, set the inversion indicator bit cells to indicate whether the number of data bit cells in a word having a zero value is greater than the number of data bit cells having a one value, invert the zeroes and ones in the bit cells when the inversion indicator bit cells are set to indicate a greater number of zeroes than ones in the data bit cells of the word, and revert the data bit cells to their value before the zeroes and ones were inverted.

20 Claims, 6 Drawing Sheets

| DATA | D0 | D1 | D2 | INVERT ? |
|---|---|---|---|---|
| | 0 | 0 | 0 | Y |
| | 1 | 0 | 0 | Y |
| | 0 | 1 | 0 | Y |
| | 1 | 1 | 0 | N |
| | 0 | 0 | 1 | Y |
| | 1 | 0 | 1 | N |
| | 0 | 1 | 1 | N |
| | 1 | 1 | 1 | N |

302

TOTAL 0s = 12

↑ INVERSION

| DATA AFTER INVERSION | D0 | D1 | D2 |
|---|---|---|---|
| | 1 | 1 | 1 |
| | 0 | 1 | 1 |
| | 1 | 0 | 1 |
| | 1 | 1 | 0 |
| | 1 | 1 | 0 |
| | 1 | 0 | 1 |
| | 0 | 1 | 1 |
| | 1 | 1 | 1 |

304

TOTAL 0s = 6

FIG. 3

ERROR RATE REDUCTION IN A NON-VOLATILE MEMORY (NVM), INCLUDING MAGNETO-RESISTIVE RANDOM ACCESS MEMORIES (MRAMS)

This is a divisional of U.S. application Ser. No. 17/247,376, filed on Dec. 9, 2020, entitled "Error Rate Reduction in a Non-Volatile Memory (NVM), Including Magneto-Resistive Random Access Memories (MRAMs)," assigned to the current assignee hereof, and hereby incorporated by reference.

BACKGROUND

Field

This disclosure relates generally to memories, and more specifically, to error rate reduction in an NVM, such as an MRAM.

Related Art

Some non-volatile memories (NVMs), such as magneto-resistive random access memories (MRAMs), are unable to reliably retain stored data at higher temperatures, such as those required for solder reflow. For example, an NVM can be attached to a customer's printed circuit board (PCB) with solder, and then the NVM and PCB exposed to a temperature of greater than 200 degrees Celsius to reflow the solder to form reliable solder joints between the NVM and PCM. A common solution for this issue is to create larger NVM cells, but this leads to significant performance, power, and area (e.g. cost) impacts. Another solution has been to include redundancy or compression, however these solutions also increase the area (e.g. cost) or complexity of the product or reduces the total memory available for the product. Therefore, a need exists for an improved NVM memory system which can reliably withstand solder reflow without loss of data.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 illustrates, in table form, example data storage and inverted data storage for the MRAM of FIG. 1, in accordance with one embodiment of the present invention.

DETAILED DESCRIPTION

As indicated above, some NVMs, including MRAMs, have insufficient margin for data integrity upon solder reflow. In one aspect, prior to solder reflow of an IC containing such NVMs, the stored data is organized or formatted with a greater error correction code (ECC) strength before solder reflow as compared to the ECC strength required later, after reflow and during normal operation of the IC. The stronger ECC is capable of correcting more errors resulting from the exposure of the IC to the higher temperatures used during the reflow process (e.g. greater than 200 degrees Celsius). For example, to reduce the bit error rate in the NVM resulting from solder reflow, data can be formatted so as to provide 3-bit correction (or higher). Additionally, the data can be selectively inverted and stored with a corresponding inversion indicator. After solder reflow, the data stored within the NVM is recovered using the inversion indicators (if used) as well as the stronger ECC. The recovered data is stored back into the NVM, but reformatted so as to provide a lesser ECC strength, which is typically faster but also sufficient for the correction of errors in the field during normal operation. While the stored data is formatted differently before and after reflow, no modification is required to the NVM bit cells or to the macro design of the NVM to achieve the error rate reduction during reflow.

Figure 1:
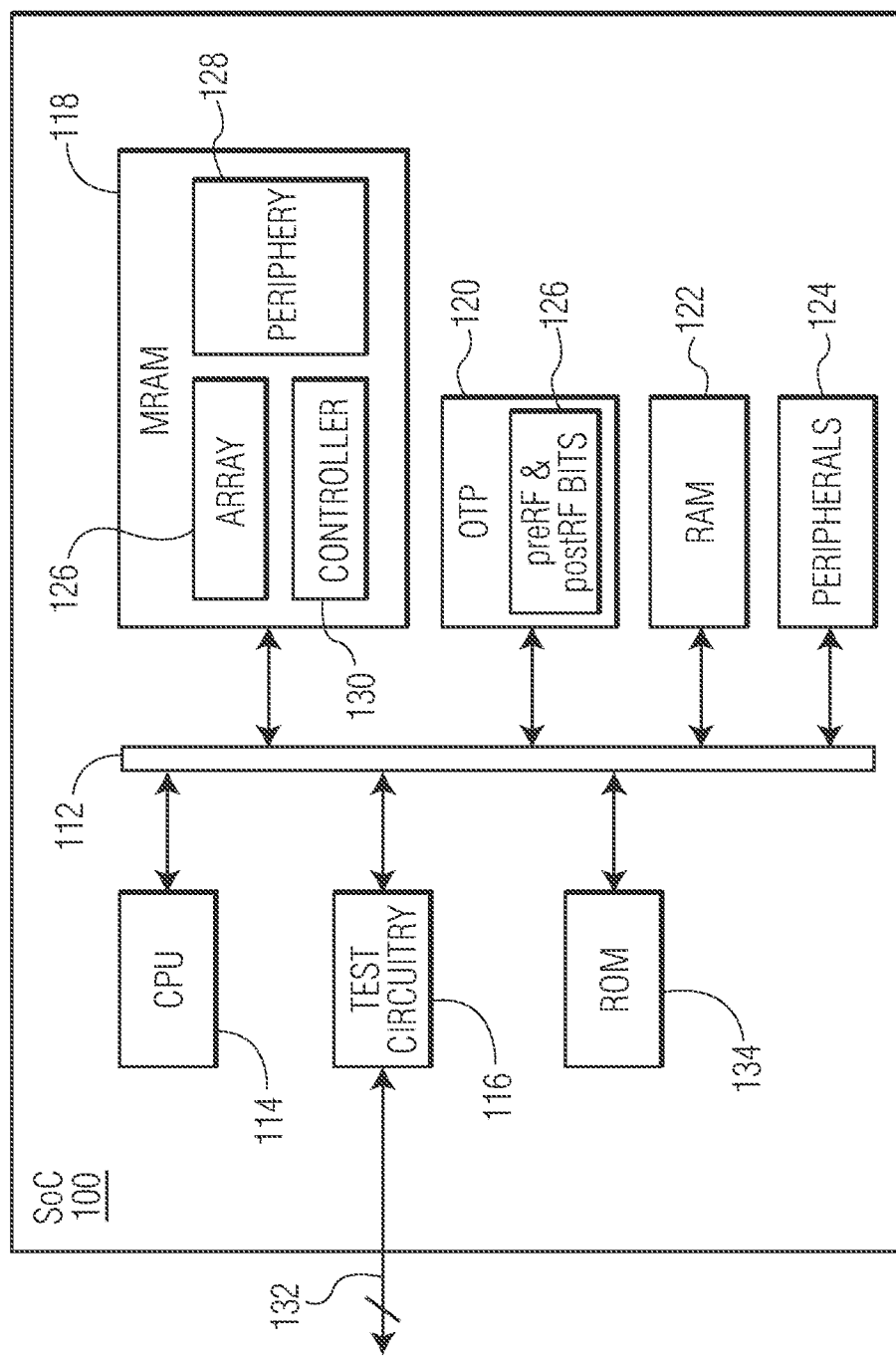
FIG. 1 illustrates, in block diagram form, an integrated circuit (IC) having an MRAM in accordance with one embodiment of the present invention.

FIG. 1 illustrates system on a chip (SoC) 100, which may be implemented on an integrated circuit (IC). Therefore, SoC 100 can also be referred to as IC 100. SoC 100 includes a central processing unit (CPU) 114, test circuitry 116, an MRAM 118, one-time programmable (OTP) storage 120, a random access memory (RAM) 122, one or more peripherals 124, read only memory (ROM) 134, and a system interconnect 112. Also, CPU 114 can instead be any type of processing element or processor. Test circuitry 116 may be a JTAG circuit (in compliance with, e.g., IEEE standard 1149.1) and can communicate external to SoC 100 via dedicated external test terminals 132. For example, test circuitry 116 may connect to an external tool via dedicated terminals 132 for testing, verifying, or debugging SoC 100. For example, test circuitry 116 may communicate with an automatic test pattern generation (ATPG) tool.

Peripherals 124 may include one or more peripherals of any type. System interconnect 112 can be any type of interconnect, such as a bus or crossbar switch. OTP 120 can be any type of OTP storage circuitry, such as, for example, fuses (including antifuses, efuses, or the like). OTP 120 stores pre-reflow (preRF) and post-reflow (postRF) bits 126, which will be described further below. Note that the elements of SoC 100 in FIG. 1 are simply examples and SoC 100 may include fewer, greater, or different elements than those illustrated in FIG. 1. Each element in SoC 100 is bidirectionally coupled to other elements of SoC 100 via system interconnect 112. Additionally, sideband signals may also be present between some elements, and SoC 100 may include any number of external terminals in addition to external terminals 132.

MRAM 118 includes an MRAM array 126 which includes an array of memory cells, each memory cell including a magnetic tunnel junction (MTJ) storage element which may be programmed into a high resistive state (HRS) or a low resistive state (LRS), in which the HRS corresponds to a first binary state and the LRS to a second binary state. For example, HRS may correspond to a logic level one and LRS to a logic level zero, or vice versa. Each MTJ can be set into the HRS or LRS based on the direction of a write current through the MTJ. In an alternate embodiment, MRAM 118 can be any type of resistive RAM (ReRAM) in which each memory cell may be any type of resistive memory cell.

MRAM 118 includes a controller 130 which receives read and write access requests via system interconnect 112 and controls reads from and writes to array 126, as known in the art. MRAM 118 also includes periphery circuitry 128 which communicates with controller 130 and includes read circuitry for performing reads from array 126, and write circuitry for performing writes to array 126. As will be described further below, periphery circuitry 128 also includes additional circuitry such as a 0's counter and data inversion circuitry.

Due to the characteristics of MRAM storage elements, one logic state (corresponding to the LRS) is more robust and reliable than the other logic state (corresponding to the HRS). For example, if the LRS corresponds to a zero logic state and HRS to a one logic state, stored zeros are more susceptible to error as temperature rises than stored ones. Therefore, in one embodiment, error rates in the stored data in array 126 can be reduced by selectively inverting those words with more zeros than ones. In one embodiment, assuming a 50% probability of ones and zeros stored in array 126, a 50% reduction in the number of zeros stored in array 126 can be achieved.

FIG. 3 illustrates a table 302 for data prior to any inversion, in which table 302 includes three data bits, D2-D0, as well as an invert column to indicate whether or not the corresponding 3-bit data value should be inverted. For those binary data values which include more zeros than ones, the invert column indicates "Yes" for inversion. For the 3-bit values of %000, %001, %010, and %100, inversion results in having more ones than zeros. For the remaining 3-bit values, there are already more ones than zeros, so no inversion is required. Table 304 of FIG. 3 illustrates the data values for each of the 3-bit values of table 302 after inverting those that should be inverted. For example, the first row is inverted such that %111 rather than %000 would get stored in array 126. Along with each 3-bit value, at least one inversion bit would also be stored with the 3-bit value to indicate if the stored value is an inverted value or not. In this manner, the original, non-inverted data can be recovered.

While the tables in FIG. 3 include 3-bit values, the same principal of inverting a data value which has more zeros than ones and storing a corresponding inversion bit can apply to any n-bit data value, in which n is any integer greater than or equal to one. Further, since the inversion bit is key in being able to recover the original data, the inversion bit may be saved redundantly, to be safe. For example, a memory array (e.g. array 126) may store 2 or 3 (or more) copies of the inversion bit for each n-bit data value. Through the use of data inversion when storing data into array 126, a reduced error rate can be achieved by storing states of data which tend to be more robust (i.e. by storing more HRS values than LRS values). Any circuitry may be used to count a number of zeros in each n-bit data value and to then invert the zeros in the n-bit data value for storage into array 126. For example, a hardware counter may be used to count the zeros, and, in each case where the count of zeros in the n-bit value is greater than 50% (greater than n/2), inversion circuitry, such as XOR logic gates, may be used to invert each bit of the n-bit data value. This circuitry may be located, for example, in periphery circuitry 128 of MRAM 118 in which the selective inversion may be performed when data is being written to array 126.

Another way to reduce the error rate of the stored data in array 126 is to increase the strength of the ECC used for error correction. Depending on the ECC algorithm used, a same number of data bits could require a different number of syndrome bits to perform the ECC. For example, more syndrome bits need to be stored for each n-bit data value for ECC which performs 3-bit error correction for the n-bit data value (in which 3 bits of erroneous data can be detected and corrected) over ECC which performs 2-bit error correction for the n-bit data value (in which only 2 bits of erroneous data can be detected and corrected).

Figure 4:
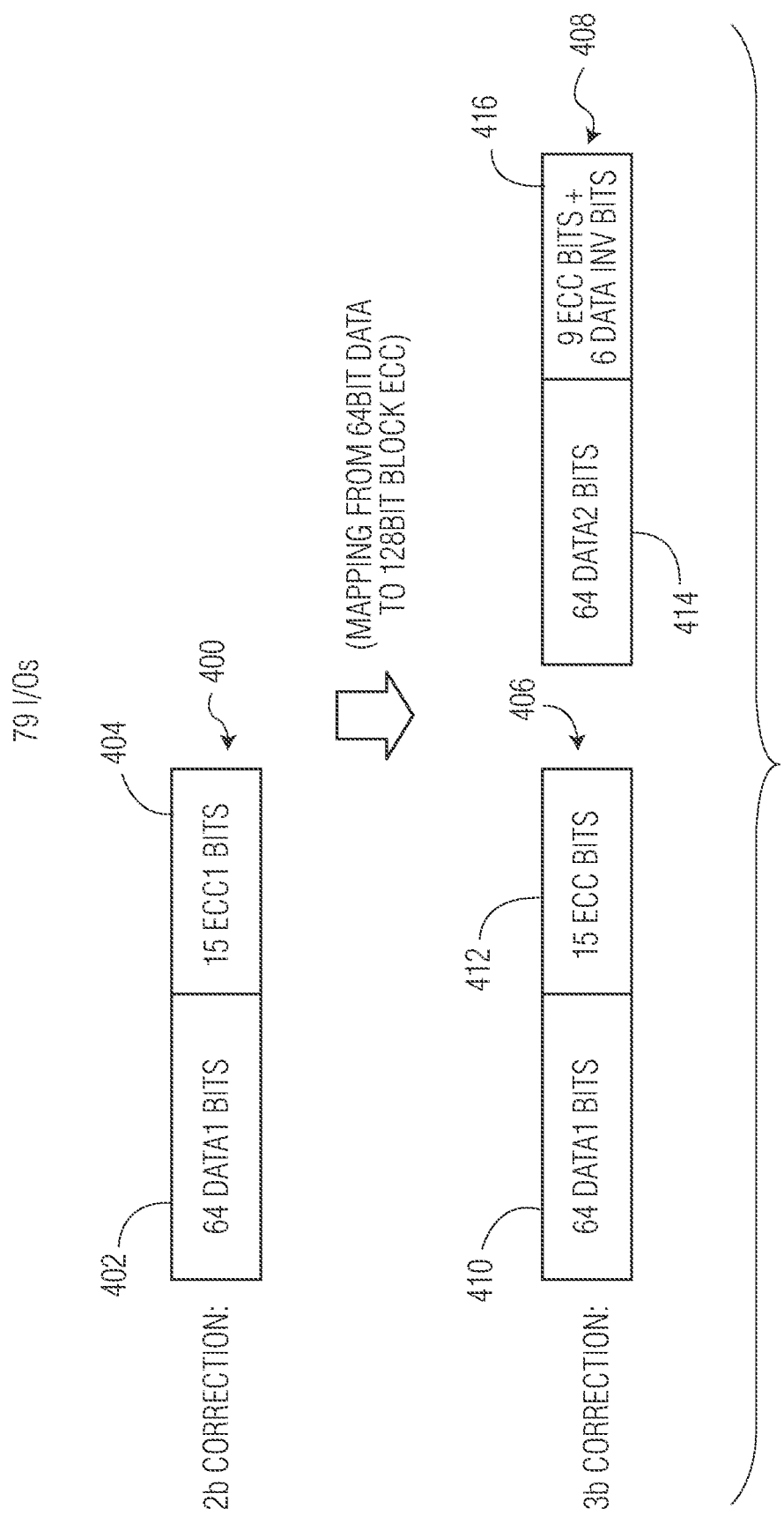
FIG. 4 illustrates, in diagrammatic form, data formats for 2-bit and 3-bit error correction, in accordance with one embodiment of the present invention.

FIG. 4 illustrates a format 400 for data stored for 2-bit error correction and formats 406 and 408, together, for data stored for 3-bit error correction. In one embodiment, data is stored in array 126 for 2-bit error correction during normal operation. That is, 2-bit error correction, under normal operating conditions, provides a sufficiently low bit error rate. As illustrated with format 400, data stored for 2-bit error correction can be organized into an n-bit data portion 402 which includes 64 data bits (corresponding to data1) and a syndrome bit portion 404 which includes 15 syndrome bits. Therefore, in this situation, a total of 79 bits (64+15) is stored for each n-bit data value. This offers a first bit error rate (e.g. which may be measured in parts per million (ppm)).

However, as illustrated with formats 406 and 408, two 64-bit data portions (e.g. data portions 410 and 414) of array 126 can be combined and treated as a 128-bit data value. The number of syndrome bits required for 3-bit error correction on a 128-bit data value is 24 bits. Since two 64-bit data portions are combined and treated as a 128-bit data value, data array 126 still has the syndrome portions 412 and 416 for each 64-bit value available for use with the combined 128-bit data value. Therefore, 30 bits are available (15 bits of syndrome portion 412 and 15 bits of syndrome portion 416). With these 30 bits, 24 bits can be used to store the syndrome bits required for 3-bit error correction on the 128-bit value, and 6 bits are left over. In one embodiment, one, some, or all of these 6 bits can be used to store inversion bits for each of the 64-bit data portions 410 and 414. For example, for each 64-bit data portion, the inversion bits may include 3 copies of the inversion bit for the corresponding 64-bit value. For the full 128-bit value, a total of 6 inversion bits (3 for each 64-bit value) can be stored with the syndrome bits. Referring to formats 406 and 408 in FIG. 4, syndrome bit portion 412 stores 15 of the total syndrome bits required for the combined 128-bit value, and syndrome portion 416 stores the remaining 9 bits of the total syndrome bits as well as the 6 inversion bits.

Note that by organizing the data in array 126 for 3-bit error correction (by combining two 64-bit values to form a 128-bit value, referred to as a combined 128-bit segment), a second bit error rate is provided, which is a reduction from the first bit error rate which uses 2-bit error correction. The increase from 2-bit error correction to 3-bit correction comes at a price in that the 3-bit error correction takes longer, but it is useful for achieving a lower bit error rate when latency is less of an issue. For example, prior to SoC 100 being attached to a PCB and being exposed to solder reflow temperatures, the data can be organized in 128-bit values with 3-bit error correction. Since SoC 100 is not yet being used in the field, the greater latency is not an issue. With the 3-bit error correction, the robustness of the stored data during the higher temperatures of the solder reflow process is improved as compared to using only 2-bit error correction. However, after solder reflow recovery, and during normal operation, the data can be reformatted back to the 64-bit values with 2-bit error corrections. The bit error rate may increase, but the latency is reduced, as compared to the format for 3-bit error correction.

Figure 2:
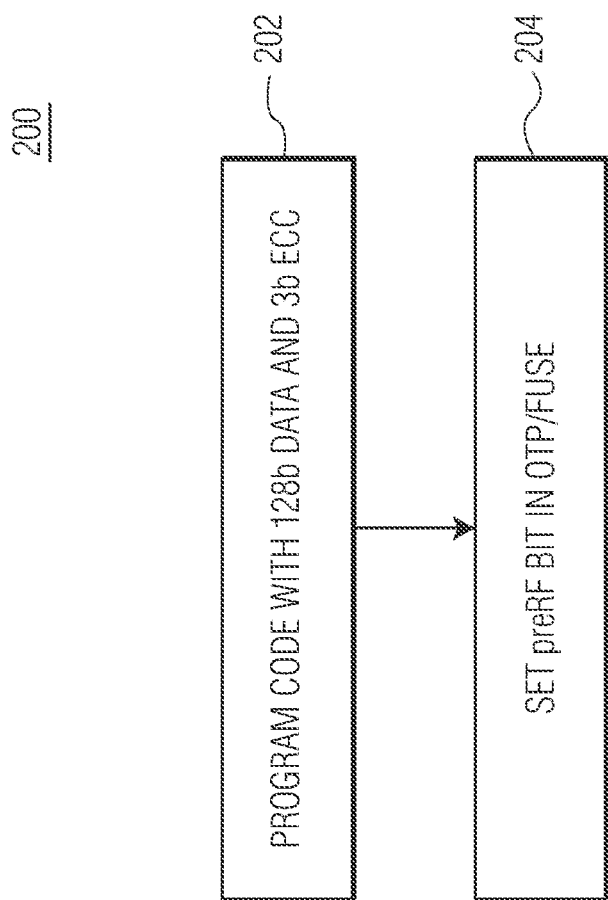
FIG. 2 illustrates, in flow diagram form, a method performed in the IC of FIG. 1 prior to solder reflow, in accordance with one embodiment of the present invention.

FIG. 2 illustrates a method 200 performed prior to solder reflow for programming MRAM array 126. In block 202, any data programmed into array 126 is programmed by combining two 64-bit values of the data into a 128-bit value and storing the necessary syndrome bits for 3-bit error correction in the syndrome bit portions corresponding to the two combined 64-bit values. If data inversion is also being utilized, the programmed data can also be selectively inverted by periphery circuitry 128 and the additional inversion bits stored as well. Once the programming of array 126 is completed using the format with the higher ECC strength, the preRF in OTP 120 is asserted to indicate that array 126 has been programmed with this modified format (as opposed to the format for normal operation with the lower ECC strength). With the stronger ECC and the selective data inversion, the data stored within array 126 can be more accurately recovered after the solder reflow.

Figure 5:
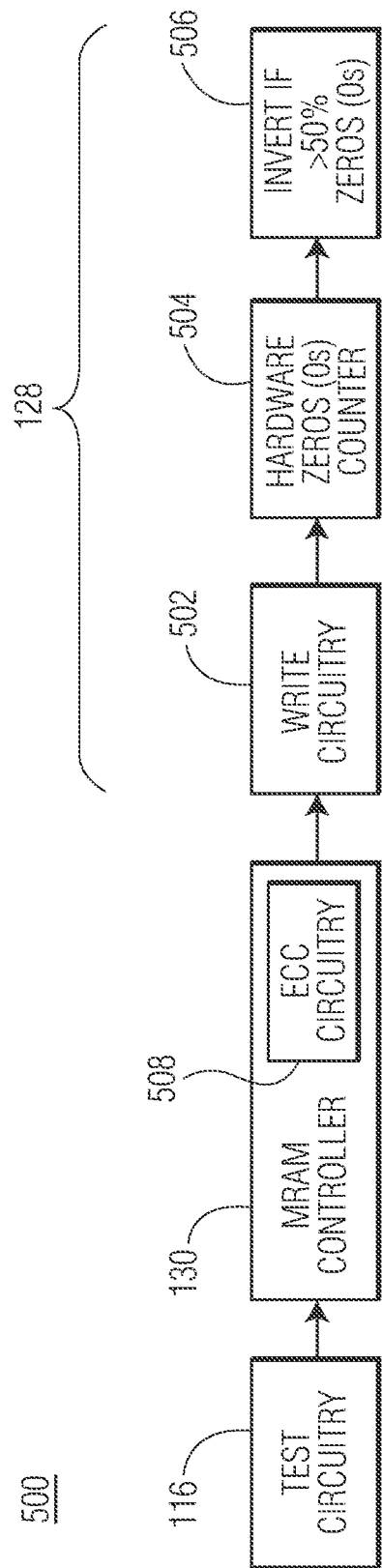
FIG. 5 illustrates, in data flow form, data movement for performing writes to the MRAM of FIG. 1 prior to solder reflow, in accordance with one embodiment of the present invention.

FIG. 5 illustrates example data movement which occurs during the programming of MRAM array 126 prior to performing the solder reflow. Data (such as code) can be provided to SoC 100 by way of a test/debug port coupled to external signals 132 in test circuitry 116. This port is accessible during manufacturing, prior to assembly (during which the solder reflow is performed). The data is provided to MRAM controller 130 which controls the write of the data into array 126. MRAM controller 130 controls the writes such that two 64-bit words are written to a memory location of array 126 along with the corresponding syndrome and inversion bits for the combined 128-bits Write circuitry 502 performs the writes in which, in the process of writing, a hardware zeros counter 504 counts the number of zeros in each data value (e.g. in each 64-bit value) being written, and inversion circuitry 506 inverts each data value if counter 504 counts greater than 50% zeros (e.g., greater than 32 zeros). Therefore, write circuitry 502 ends up, for each combined data segment (including the two combined 64-bit values), writing the selectively inverted combined 128-bit segment to array 126, along with the appropriate inversion bits (e.g. a triple copy of the inversion bit for each of the 64-bit values). In one embodiment, each of write circuitry 504, hardware zeros counter 504 and inversion circuitry 506 are located within periphery circuitry 128 of MRAM 118.

Note also that stored along with the 128-bit data segment and the corresponding inversion bits are the corresponding syndrome bits (e.g. 24-bit syndrome for the 128-bit value). The syndrome bits are determined by ECC circuitry 508 which may be located within MRAM 118, such as within MRAM controller 130. Alternatively, ECC circuitry 508 may be located in periphery circuitry 128. These syndrome bits, along with the inversion bits (e.g. for a total of 30 bits), are stored with the 128-bit segment. Therefore, upon the initial writing of data received by test circuitry 116 during manufacture, ECC circuitry 508 applies an ECC algorithm for 3-bit correction to each 128-bit segment to obtain the corresponding syndrome bits. Note that ECC circuitry 508 also performs the appropriate ECC algorithm (e.g. 2-bit or 3-bit correction) on read data output from array 126 in order to provide corrected read data from MRAM 118.

Figure 6:
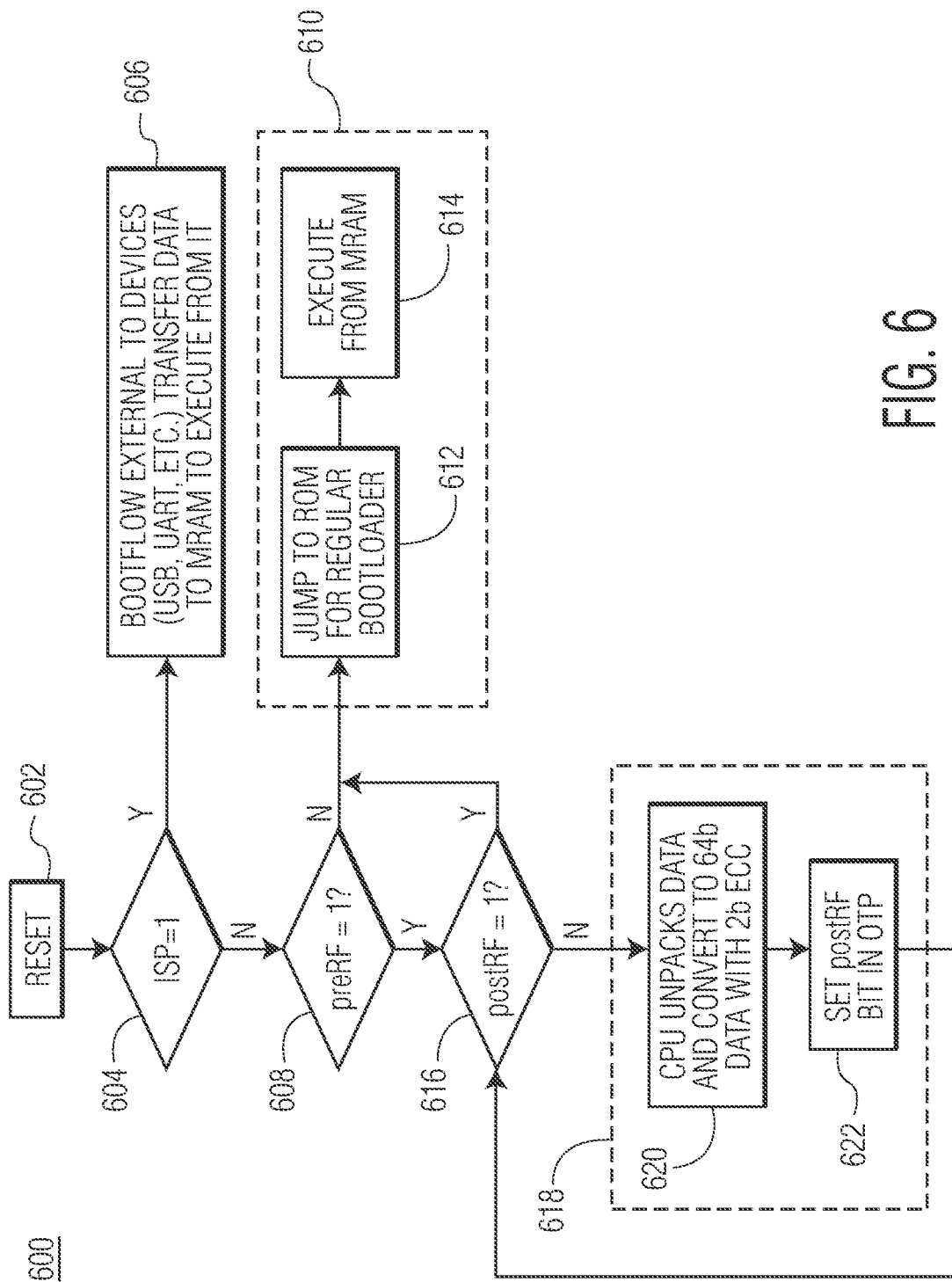
FIG. 6 illustrates, in flow diagram form, a method performed in the IC of FIG. 1 after solder reflow, in accordance with one embodiment of the present invention

By storing data into array 126 in accordance with 3-bit error correction rather than 2-bit error correction, the data in array 126 is more likely to be accurately recovered from array 126 after exposure to the high temperatures required for solder reflow. FIG. 6 illustrates a method 600 which is performed in SoC 100 after solder reflow. For example, once array 126 is programmed with 3-bit correction and the preRF bit is asserted, SoC 100 is subsequently assembled in which it is attached to a PCB with solder and subjected to a solder reflow to form reliable solder joints between SoC 100 and the PCB. In method 600, SoC 100 is reset in block 602. Next, at decision diamond 604, it is determined whether In System Programming (ISP) is indicated, such as by checking an ISP bit or flag. If asserted (e.g. a logic level one), the bootflow for SoC 100 is performed from a memory external to SoC 100. For example, boot code can be transferred from an external source via a Universal Serial Bus (USB) or a Universal Asynchronous Receiver-Transmitter (UART) into MRAM array 126 for execution.

If In System Programming (ISP) is not indicated, method 600 proceeds to decision diamond 608 in which it is determined whether the preRF bit is asserted (e.g. a logic level one). If it is asserted, it means that MRAM array 126 was programmed with 128-bit segments with 3-bit error correction (as described in reference to FIG. 2). That is, if the preRF bit is asserted, the data is known to be organized as data formats 406 and 408 of FIG. 4. If it is organized as such (preRF=1), method 600 proceeds to decision diamond 616 in which it is determined whether the post reflow (postRF) bit is asserted (e.g. to a logic level one).

If the postRF bit is not yet asserted (still negated), this is the first time that SoC 100 has been reset since the pre-reflow programming of FIG. 2. Therefore, during the first time, method 600 proceeds to section 618 (corresponding to the "first time after reflow" bootflow) which begins with block 620 in which CPU 114 unpacks (i.e. recovers and corrects) the data in array 126 and converts it back to the format of 64-bit data with 2-bit correction and then to block 622 in which the postRF bit is asserted. Method 600 then returns to decision diamond 616. Unpacking the data in array 126 is performed by the read circuitry reading the 64-bit data values from array 126 (as controlled by controller 130), in which inversion circuitry 506 recovers the original non-inverted data using the values of the corresponding inversion bits. Since there are 3 inversion bits for each 64-bit value, a hardware voting mechanism can be used to determine what value of the inversion bit to use in the situation where the 3 inversion bits do not match in value. ECC circuitry 508 also performs error correction on the full 128-bit segments read from array 126 using the corresponding 24 syndrome bits in accordance with the 3-bit correction ECC algorithm.

Memory controller 130 then controls the writing of the recovered and corrected data back to array 126, but organized in accordance with format 400 of FIG. 4 in which each 128-bit segment is separated such that each separated data value is stored with its own corresponding syndrome bits for 2-bit error correction. For example, each 128-bit segment is stored back to array 126 by write circuitry 502 as a first 64-bit data value and its corresponding 15 syndrome bits and a second 64-bit data value with its corresponding 15 syndrome bits. The syndrome bits for each 64-bit data value is determined by ECC circuitry 508 in accordance with the 2-bit correction ECC algorithm. After the data is reformatted and written back to array 126, the postRF bit is asserted indicating that the data stored within array 126 is organized in accordance with 2-bit error correction (e.g. format 400 of FIG. 4).

Note that upon unpacking and converting the data back to 2-bit correction in array 126, the selective inversion is no longer performed and therefore, no inversion bits are needed. In this manner, the same size array 126 can be used to store the data in accordance with the 3-bit correction with selective inversion and in accordance with the 2-bit correction. For example, for a 128-bit data segment in the former situation, two 64-bit data portions are required along with a 30-bit syndrome/inversion portion (24 syndrome bits and 6 inversion bits), while for the latter situation, each 64-bit data value of a 128-bit data segment requires a 15-bit syndrome portion, for a total of 30 bits. Therefore, each 128-bit segment of array 126 can be formatted or organized for either for 3-bit correction and selective inversion or for 2-bit correction. The size of array 126 need not be designed differently to take advantage of the more robust error correction during solder reflow.

Referring back to decision diamond 608, if the preRF bit is not asserted, method 600 proceeds to section 610 which corresponds to the regular bootflow (applying to all but the first bootflow). If the preRF bit is not asserted, then array 126 was never programmed with the 3-bit correction format (i.e. block 202 of FIG. 2 did not occur and thus the preRF bit was never asserted). In this case, data in array 126 is stored in accordance with 2-bit correction (e.g. in which each 64-bit portion has its corresponding 15-bit syndrome portion). Similarly, if both the preRF and postRF bits are asserted, then the data in array 126 was first programmed in accordance with 3-bit correction (prior to solder reflow) and then unpacked and converted to 2-bit correction (after reflow). Since in either case (in which preRF is negated or in which both preRF and post RF are asserted), the data in array 126 is stored in accordance with 2-bit correction, the regular bootflow is performed. Within regular bootflow section 610, in block 612, CPU 114 may first jump to ROM 134 and transfer the bootloader code from the ROM to MRAM 118, and, in block 614, execute the bootloader code from MRAM 118.

While the descriptions above have been described in reference to a 64-bit data value being stored with 15 syndrome bits for 2-bit error correction and to a 128-bit data segment being stored with a total of 30 syndrome/inversion bits for 3-bit error correction, alternate embodiments may store any n-bit value with the necessary syndrome bits for 2-bit error correction, and combine two or more of the n-bit values to form an m×n bit segment in which the syndrome portion of each n-bit value can be used to store corresponding inversion bits for each n-bit value as well as corresponding syndrome bits for the m×n bit segment for 3-bit error correction. (In this case, each of m and n can be any integer value.) Also, while 3-bit error correction is used herein to provide a more robust ECC for solder reflow and 2-bit error correction is used to provide a faster but less robust ECC after reflow or during normal operation, different types and levels of ECC may be used prior to and after reflow. For example, if needed, an even more robust ECC may be used, such as 4-bit correction, prior to reflow.

In an alternate embodiment, selective inversion may or may not be used with the 3-bit correction format. In this case, there would be leftover bits (e.g. 6 bits) in each 128-bit segment to use for other purposes. In another alternate embodiment, one or more inversion bits may be stored per 64-bit value. For example, any odd number of inversion bits greater than one (e.g. 3, 5, 7, etc.) can be stored in which a voting mechanism can be used to determine the "winning value" of the stored inversion bits.

In one embodiment, though, through the use of 3-bit correction in combination with the inversion bits, a sufficiently robust ECC is provided to protect the data in MRAM 118 during solder reflow (in which, due to the higher temperatures of greater than 200 degrees Celsius, the stored data in MRAM 118 is more susceptible to corruption). For example, for a given memory size, the maximum error rate for using 3-bit error correction on the combined 128-bit segments is about six times greater than the maximum error rate for using 2-bit correction for each 64-bit value. Furthermore, by also using selective inversion for the stored data during reflow, an even greater improvement in the maximum error rate can be achieved. Also, by using the 3-bit correction format and then converting back to the 2-bit correction format, no additional bits are needed (over the 2-bit correction format) to implement the 3-bit format. For example, as described above, a 128-bit data portion with a 30-bit syndrome/inversion portion is sufficient for 3-bit correction of a 128-bit value with up to 6 inversion bits and sufficient for 2-bit correction of two separate 64-bit values.

Therefore, by now it can be appreciated how data stored in an NVM, such as an MRAM, can be better protected when exposed to higher solder reflow temperature. The error bit rate can be reduced by applying a more robust (e.g. stronger) ECC algorithm (e.g. ECC which provides for 3-bit correction) during reflow and reformatting the data to apply a less robust, but faster, ECC algorithm (e.g. ECC which provides for only 2-bit correction) after reflow and during normal operation. The error bit rate during reflow can be further reduced by selectively inverting the weaker stored logic state to the stronger stored logic state (e.g. zeros to ones) within the stored data so that more of the stored data is stored using the stronger logic state. Furthermore, by reorganizing the data between a format which stores a syndrome for every n-bit data value and a format which stores a syndrome for multiple combined n-bit data values, no additional storage space is required within the NVM array to achieve the improved error rate during reflow. Therefore, the improved error rate can be achieved without increasing the size of the memory or increasing the size and robustness of the individual memory cells.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Brackets are used herein to indicate the conductors of a bus or the bit locations of a value. For example, "bus 60 [7:0]" or "conductors [7:0] of bus 60" indicates the eight lower order conductors of bus 60, and "address bits [7:0]" or "ADDRESS [7:0]" indicates the eight lower order bits of an address value. The symbol "$" preceding a number indicates that the number is represented in its hexadecimal or base sixteen form. The symbol "%" preceding a number indicates that the number is represented in its binary or base two form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of SoC 100 are circuitry located on a single integrated circuit or within a same device. Alternatively, the elements of SoC 100 10 be implemented with any number of separate integrated circuits or separate devices interconnected with each other. For example, additional memory or some or all of the peripherals may be located on separate integrated circuits or devices which can be separately assembled to the PCB during assembly.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the circuitry within MRAM 118 may be organized differently or MRAM 118 can be implemented with a different resistive RAM or different NVM. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit (IC) device includes a magnetoresistive random-access memory (MRAM) device including: an array of MRAM bit cells grouped into words, each word having specified number of data bit cells, error correction code (ECC) bit cells, and at least two inversion indicator bit cells, the inversion indicator bit cells are redundant of each other; and a memory controller coupled to the array of bit cells. The memory controller is configured to, for each of the words: set the inversion indicator bit cells to indicate whether the number of data bit cells in a word having a value of zero is greater than the number of data bit cells in the word having a value of one, invert the zeroes and ones in the bit cells when the inversion indicator bit cells are set to indicate a greater number of zeroes than ones in the data bit cells of the word, and revert the data bit cells to their value before the zeroes and ones were inverted. In one aspect, the zeroes and ones in the bit cells are inverted before the IC device is attached to a substrate using a solder reflow process; and after the solder reflow process, the data bit cells are reverted to their value before the zeroes and ones were inverted. In another aspect of this embodiment, the memory controller is further configured to, before the solder reflow process, program the data bit cells in pairs of the words and assign less than the number of ECC bit cells originally allocated to the respective pairs of the words as ECC bit cells for the pair of the words. In a further aspect, the memory controller is further configured to, as the data bit cells of the pairs of the words are programmed, the invert the zeroes and ones in the bit cells is performed when the inversion indicator bit cells are set to indicate a greater number of zeroes than ones in the data bit cells of the pairs of the words. In another further aspect, the memory controller is further configured to set a one-time programmable element as a pre-reflow indicator to indicate the pairs of the words have been programmed. In a further aspect, the memory controller is further configured to, during a first bootup after the solder reflow process, if the pre-reflow indicator indicates the pairs of the words have been programmed, unpack the data in the pairs of the words into separate words and assign the separate words to the ECC bit cells originally allocated to the separate words. In yet a further aspect, unpacking the data includes reverting the data bit cells in each of the words to their value before the zeroes and ones were inverted when the inversion indicator bit cells are set to indicate a greater number of zeroes than ones in the data bit cells. In another aspect, the memory controller is further configured to after the first bootup, set a post reflow indicator in a one-time programmable storage element to indicate the data is unpacked and reverted. In a further aspect, the memory controller is further configured to, during a reset, when the pre-reflow indicator indicates the pairs of the words have been programmed and the post reflow indicator indicates the data is unpacked, use a standard bootflow and operate using the data in the MRAM bit cells. In another aspect, the memory controller is further configured to during bootup after the solder reflow process, before checking whether the pre-reflow indicator indicates the pairs of the words have been programmed, use an external bootflow to transfer data to the MRAM bit cells when an in-system programming indicator is set.

In another embodiment, a method of programming a nonvolatile magnetoresistive random access memory (MRAM) device includes: before a solder reflow process, combining separate words of MRAM data bit cells to form longer words of MRAM data bit cells; assigning to the longer words less than a number of error correction code (ECC) bits originally allocated to the respective separate words; using at least one of the ECC bits as an inversion indicator for each of the longer words; programming data into the longer words, wherein the programming includes, for each of the longer words, inverting ones and zeros in the data bit cells of the longer word when the number of zeros is greater than the number of ones to be programmed in the longer word; and setting the inversion indicator to indicate whether a respective one of the longer words has been inverted due to a number of zeros being greater than a number of ones to be programmed in the data bit cells of the longer word. In one aspect, the method further includes, after the solder reflow process, reverting the data bit cells to their value before the zeroes and ones were inverted when the inversion indicator indicates a respective one of the longer words has been inverted. In another aspect, the method further includes setting a one-time programmable element as a pre-reflow indicator to indicate the pairs of the words have been programmed, but reflow has not yet occurred. In a further aspect, the method further includes, during a first bootup after the solder reflow process, if the pre-reflow indicator indicates the pairs of the words have been programmed, unpacking the data in the longer words into the corresponding separate words and assign the separate words to the ECC bit cells originally allocated to the separate words. In a further aspect, the method further includes unpacking the data includes reverting the data bit cells in each of the longer words to their value before the zeroes and ones were inverted when the inversion indicator bit cells are set to indicate a greater number of zeroes than ones in the data bit cells. In another aspect, the method further includes, after the first bootup, setting a post reflow indicator in a one-time programmable storage element to indicate the data is unpacked and reverted. In a further aspect, the method further includes, during a reset, when the pre-reflow indicator indicates the pairs of the words have been programmed and the post reflow indicator indicates the data is unpacked, using a standard bootflow and operating using the data in the MRAM bit cells. In another aspect, the method further includes, during bootup after the solder reflow process, before checking whether the pre-reflow indicator indicates the pairs of the words have been programmed, using an external bootflow to transfer data to the MRAM bit cells when an in-system programming indicator is set. In another aspect, the method further includes using remaining ECC bits as syndrome bits for use by an ECC algorithm for the memory device. In a further aspect, the method further includes storing the syndrome bits and the inversion indicator with the respective one of the longer words.

What is claimed is:

1. A method of programming a nonvolatile magnetoresistive random access memory (MRAM) device, the method comprising:
before a solder reflow process, combining separate words of MRAM data to form longer words of MRAM data;
assigning to each longer word a number of error correction code (ECC) bits in accordance with a first bit error correction rate that is less than a total number of error correction code (ECC) bits in accordance with a second bit error correction rate originally allocated to the respective separate words combined to form the longer word;
programming data into data bit cells of the MRAM as the longer words, wherein the programming includes, for each of the longer words:
  inverting ones and zeros of each respective separate word when storing the respective separate word into the data bits cells as the longer word when the number of zeros is greater than the number of ones to be programmed in the data bit cells;
  storing an inversion indicator bit for each respective separate word into the data bit cells to indicate whether the respective separate word has been inverted due to a number of zeros being greater than a number of ones to be programmed in the data bit cells; and
  storing ECC bits generated from the longer word in accordance with the first bit error correction rate into the data bit cells.

2. The method of claim 1 further comprising:
after the solder reflow process, reverting the data bit cells to their value before the zeroes and ones were inverted when the inversion indicator bit indicates the respective separate word has been inverted.

3. The method of claim 1 further comprising:
setting a one-time programmable element as a pre-reflow indicator to indicate the longer words have been programmed, but reflow has not yet occurred.

4. The method of claim 3 further comprising:
during a first bootup after the solder reflow process, if the pre-reflow indicator indicates the longer words have been programmed, unpacking the data in the longer words into the corresponding separate words and assign to the separate words the ECC bit cells originally allocated to the separate words to store ECC bits generated from the corresponding separate word in accordance with the second bit error correction rate.

5. The method of claim 4 further comprising:
unpacking the data in the longer words includes reverting the data bit cells in each of the separate words to their value before the zeroes and ones were inverted when the inversion indicator bit of the respective separate word is set to indicate a greater number of zeroes than ones in the data bit cells.

6. The method of claim 4 further comprising:
after the first bootup, setting a post reflow indicator in a one-time programmable storage element to indicate the data is unpacked and reverted.

7. The method of claim 6 further comprising:
during a reset, when the pre-reflow indicator indicates the longer words have been programmed and the post reflow indicator indicates the data is unpacked, using a standard bootflow and operating using the data in the MRAM bit cells.

8. The method of claim 4 further comprising:

during bootup after the solder reflow process, before checking whether the pre-reflow indicator indicates the longer words have been programmed, using an external bootflow to transfer data to the data bit cells of the MRAM when an in-system programming indicator is set.

9. The method of claim 1 wherein the second bit error correction rate is less robust than the first bit error correction rate such that, for each of the programmed longer words:

the number of ECC bits generated from the longer word in accordance with the first bit error rate in combination with a number of inversion indicator bits for the respective separate words combined to form the longer word is less than or equal to the total number of ECC bits in accordance with the second bit error correction rate originally allocated to the respective separate words combined to form the longer word.

10. The method of claim 9 wherein the ECC bits and inversion bits for each longer word are stored with the longer word.

11. A method of programming a nonvolatile magnetoresistive random access memory (MRAM) device, the method comprising:

before a solder reflow process:

receiving MRAM data; and programming the MRAM data into data bit cells of the MRAM as combined pairs of words, wherein for each pair of words, the programming includes:

inverting ones and zeros of each corresponding word in the pair of words upon storing the corresponding word into the data bit cells when a number of zeros in the corresponding word to be programmed in the data bit cells is greater than a number of ones in the corresponding word to be programmed in the data bit cells;

storing an inversion indicator bit for each corresponding word to indicate whether or not ones and zeros in the corresponding word are stored inverted; and storing syndrome bits generated from the combined pair of words in accordance with a first bit error correction rate, wherein the inversion indicator bits of the corresponding words and the syndrome bits for the combined pair of words are stored with the combined pair of words in the data bit cells of the MRAM.

12. The method of claim 11, wherein, for each pair of words, the inversion indicator bits of the corresponding words and the syndrome bits for the combined pair of words are stored in ECC bit cells corresponding to both words of the pair of words.

13. The method of claim 11, further comprising:

after the programming the MRAM data into data bit cells of the MRAM as combined pairs of words, asserting a first flag to indicate that the data bit cells are programmed as pairs of words with syndrome bits generated in accordance with the first bit error correction rate.

14. The method of claim 13, further comprising:

resetting the MRAM device;

after the resetting, when the first flag is asserted, unpacking the programmed data bit cells of the MRAM, wherein the unpacking comprises:

reading each word from the data bit cells; and reverting bits in each word to their original value before the zeroes and ones were inverted when the inversion indicator bit for the corresponding word indicates that the ones and zeros in the corresponding word were stored inverted.

15. The method of claim 14, wherein the unpacking further comprises:

storing each word of each pair of words as a separate word into data bit cells of the MRAM, and storing syndrome bits generated from each separate word in accordance with a second bit error correction rate, wherein the syndrome bits for each separate words are stored with the separate word in the data bit cells of the MRAM, and the second bit error correction rate is less robust than the first bit error correction rate.

16. The method of claim 15, wherein, for each separate word, the syndrome bits for the separate word are stored in ECC bit cells corresponding only to the separate word.

17. The method of claim 15 further comprising:

after the unpacking, setting a second flag to indicate the MRAM data is unpacked and reverted.

18. The method of claim 17 further comprising:

during a reset of the MRAM device, when the first flag indicates the MRAM data has been programmed as combined pairs of words and the second flag indicates the data is unpacked, using a standard bootflow and operating using the data in the MRAM bit cells.

19. The method of claim 12, wherein for each pair of words, each inversion indicator bit is stored at least in duplicate.

20. The method of claim 13, wherein after the first flag is asserted, performing the solder reflow process on the MRAM device.

* * * * *